United States Patent
Bjorklund et al.

[11] Patent Number: 5,755,471
[45] Date of Patent: May 26, 1998

[54] ACTUATOR STEM AND ACTUATOR DESIGN HAVING A D-SHAPED CROSS-SECTION

[75] Inventors: James M. Bjorklund; Bryan K. Banner, both of Boise, Id.

[73] Assignee: MIcron Electronics, Inc., Boise, Id.

[21] Appl. No.: 602,346

[22] Filed: Feb. 16, 1996

[51] Int. Cl.$^6$ ................................................. A47J 45/00
[52] U.S. Cl. .................................. 294/64.1; 29/743
[58] Field of Search ...................... 92/165 R, 165 PR, 92/177, 130 R; 29/743, 840; 414/225, 737; 901/40; 294/64.1

[56] References Cited

U.S. PATENT DOCUMENTS

| | | | |
|---|---|---|---|
| 4,523,515 | 6/1985 | Smith | 92/165 PR |
| 4,713,976 | 12/1987 | Wilkes | 74/190 |
| 4,769,904 | 9/1988 | Porterfield et al. | 29/840 |
| 5,073,149 | 12/1991 | Maruyama et al. | 474/110 |
| 5,588,203 | 12/1996 | Bidefeld | 29/743 |

FOREIGN PATENT DOCUMENTS

| | | | |
|---|---|---|---|
| 1204025 | 10/1965 | Germany | 92/165 R |
| 2099080 | 12/1982 | United Kingdom | 92/165 PR |

*Primary Examiner*—Thomas E. Denion
*Attorney, Agent, or Firm*—Kirkpatrick & Lockhart LLP

[57] ABSTRACT

An improved actuator stem and actuator design are provided that greatly increase the accuracy of actuator type precision operations, such as surface mounted electrical component placement, die and attach tooling movements, and tape and reel part storage tooling. The actuator includes a housing having an inner surface and containing a first opening, a stem having a first end, an axis passing through said first end, and a cross section perpendicular to the axis having at least one edge. The stem is slidably disposed in the housing with the first end extending through the first opening substantially parallel to the axis. The stem is actuated along the axis by conventional methods, such as a spring. A portion of the inner surface conforms to a portion the cross section of the stem so as to prevent the stem from rotating about the axis. In a preferred embodiment, the stem has a D-shaped cross section perpendicular to the stem axis over the entire length of the stem in the direction of the axis. Alternatively, the cross section can be other shapes having an edge and need not have the same shape cross section of the entire length of the stem. In a preferred embodiment for a pick and place machine, the stem of the actuator is in the form of a D-shaped nozzle that is used in conjunction with a spring actuated stationary head to provide significantly increased performance levels.

30 Claims, 3 Drawing Sheets

ACTUATOR STEM AND ACTUATOR DESIGN HAVING A D-SHAPED CROSS-SECTION

BACKGROUND OF THE INVENTION

1. Field of the Invention

The present invention relates generally to an improved actuating stem and actuator design to prevent rotation of the actuator stem during operation. More particularly, the present invention relates to an improved actuating nozzle design for use with spring actuated tooling, such as surface mount placement equipment, die and attach equipment, tape and reel production and the like.

2. Description of the Invention Background

Solid state electrical devices are typically produced by attaching a plurality of miniaturized electrical components to a common substrate, such as a printed circuit board. The proper performance of the device is dependent upon the precise placement of each electrical component on the substrate. Recent advances in the miniaturization of electronics have brought about the need for component placement capabilities with accuracies within a few hundred microns. The difficulty in placing electrical components to that level of precision limits the achievable miniaturization of the device, which is directly related to the operational speed of the device, and the variability in the performance characteristics of the device.

The placement of electrical components is commonly performed using a pick and place machine, such as the Fuji IP-II manufactured by Fuji Machine Mfg. Co., Ltd. (Japan), to surface mount the electrical components on the substrate. Pick and place machines typically employ a number of movable heads each having a nozzle through which a vacuum or suction is applied to pick a component off a continuous feed assembly, such as a tape and reel assembly. The component is held against the nozzle by the vacuum or suction. A computer in the pick and place machine is used to control the movement of the head and the machine precisely places the component on the substrate and the vacuum or suction is then released.

The movement of the heads during the picking and placing operations is controlled either electronically or is set to a predetermined distance. In electronically controlled heads, the head is driven by a specially dedicated motor and the precise distance between the head and the location where the component is to be picked up or placed is encoded into the computer and the movement of the head is precisely incremented to perform the pick and place operation. In pick operations using a spring actuated head, the computer aligns and lowers the head to a preset level without taking into account the size of the component. When the nozzle contacts the component prior to reaching the preset level, the spring compresses to avoid crushing the component or damaging the nozzle. Once the preset level is reached, the machine then lifts the head and the component off the feed assembly. The force exerted by the spring ensures good contact between the nozzle and the component so that a sufficient vacuum or suction can be applied to lift the component off the assembly. The placement of the component using the spring actuated head occurs in an analogous fashion.

The electronically controlled heads represent the state of the art in pick and place machine heads; however, the sophisticated electronics and encoding required to the operate of the heads dramatically increases the cost of the machine. As such, most pick and place machines do not exclusively use electronically controlled heads, but also employ spring actuated heads to provide increased capacity. For example, the Fuji IP-II pick and place machine contains two electronically controlled heads and two spring actuated heads.

The spring actuated heads provide control over the placement of small articles, such as those less than 10 mm×10 mm, comparable to the electronically controlled heads. However, the precision of the spring actuated heads diminishes when used with larger articles. When the spring actuated heads are used to place larger components (i.e. greater than 10 mm×10 mm), the compressive and expansive forces exerted by the components on the spring are transferred as helical forces on the attached nozzle. The helical forces generated by the spring skews the orientation of the nozzle such that larger components can not be placed using spring actuated heads with the same precision achievable with smaller components. The inability to precisely place larger components with the spring actuated heads has resulted in a dramatic reduction in the overall capacity of pick and place machines because only the electronically controlled heads can be used to reliably place large components, such as 20-lead SOJs.

Advances in semiconductor technology have resulted in the development of larger, more efficient components to be used in electrical devices and, as such, have placed increasing demands on the capabilities of manufacturers to produce large component devices. The primary options that manufacturers have to increase their capabilities are to upgrade their present equipment by replacing all of the spring actuated pick and place heads with electronically controlled heads or to purchase new pick and place equipment which consist entirely of electronically controlled heads. Either of these options represent significant expenditures and possibly a significant loss due to the premature retiring of existing machinery, both of which will greatly increase the overall production cost of the devices. There are approximately 15,000 of the Fuji IP-II machines in use worldwide, in addition to pick and place machines by other manufacturers. Many of such machines are used to place larger components, but cannot exploit the full capacities of the machines due to the size limitations of the spring actuated heads. Also, various die and attach equipment and tape and reel production machines suffer the same problems with spring actuated placement heads. As such, there is great need to increase the utility of spring actuated heads for the placement of larger components using existing machinery.

The present invention is directed to an improved spring actuated nozzle design which overcomes, among others, the above-discussed problems so as to allow spring actuated head to be used to place components that are over seven times larger than the largest component placed using the prior art designs.

SUMMARY OF THE INVENTION

The above objects and others are accomplished by an actuator design in accordance with the present invention. The actuator includes a housing having an inner surface and containing a first opening, a stem having a first end, an axis passing through said first end, and a cross section perpendicular to the axis having at least one edge. The stem is slidably disposed in the housing with the first end extending through the first opening and the stem is actuated parallel to the axis by conventional methods, such as a spring. A portion of the inner surface conforms to a portion of the cross section of the stem so as to prevent the stem from rotating about the axis. In a preferred embodiment, the stem has a D-shaped cross section perpendicular to the stem axis over the entire length of the stem in the direction of the axis. Alternatively, the cross section can be other shapes having an edge and need not have the same shape cross section over the entire length of the stem. In a preferred embodiment for apparatus such as a Fuji IP-II pick and place machine, the stem of the actuator is in the form of a D-shaped nozzle that is used in conjunction with a spring actuated stationary head to provide significant increased performance levels.

Accordingly, the present invention provides cost effective means to greatly increase the overall capacity of pick and place machine. These and other details, objects, and advantages of the invention will become apparent as the following detailed description of the present preferred embodiment thereof proceeds.

BRIEF DESCRIPTION OF THE DRAWINGS

The preferred embodiment of the present invention will be described in greater detail with reference to the accompanying drawings, wherein like members bear like reference numerals and wherein.

DETAILED DESCRIPTION OF THE PREFERRED EMBODIMENTS

Figure 1:
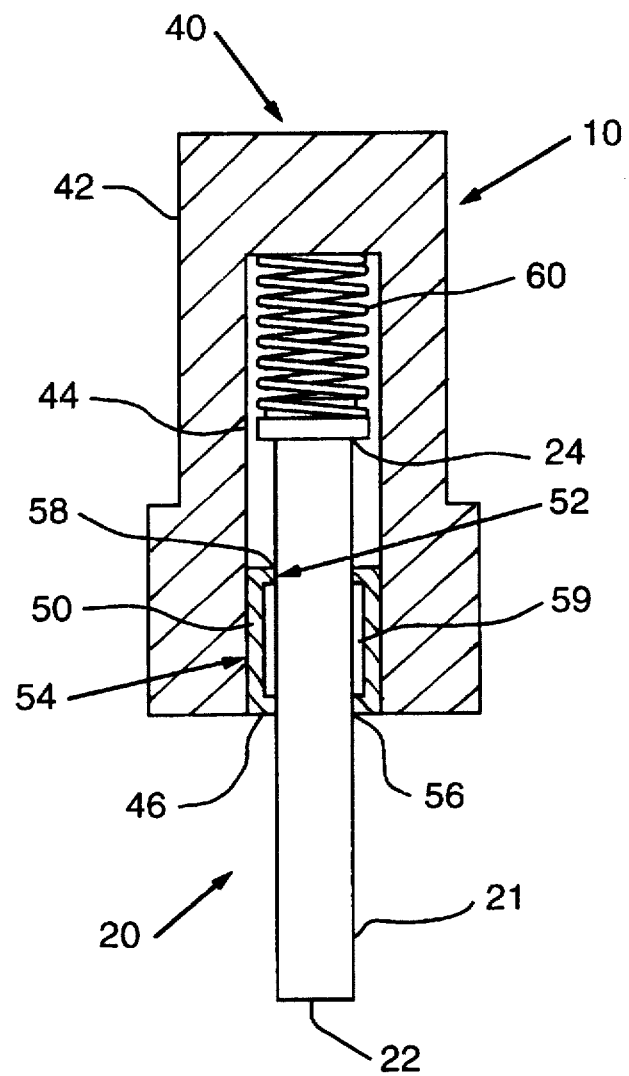
FIG. 1 is a cross sectional view of a preferred embodiment of the present invention using a spring actuator.
Figures 2, 3:
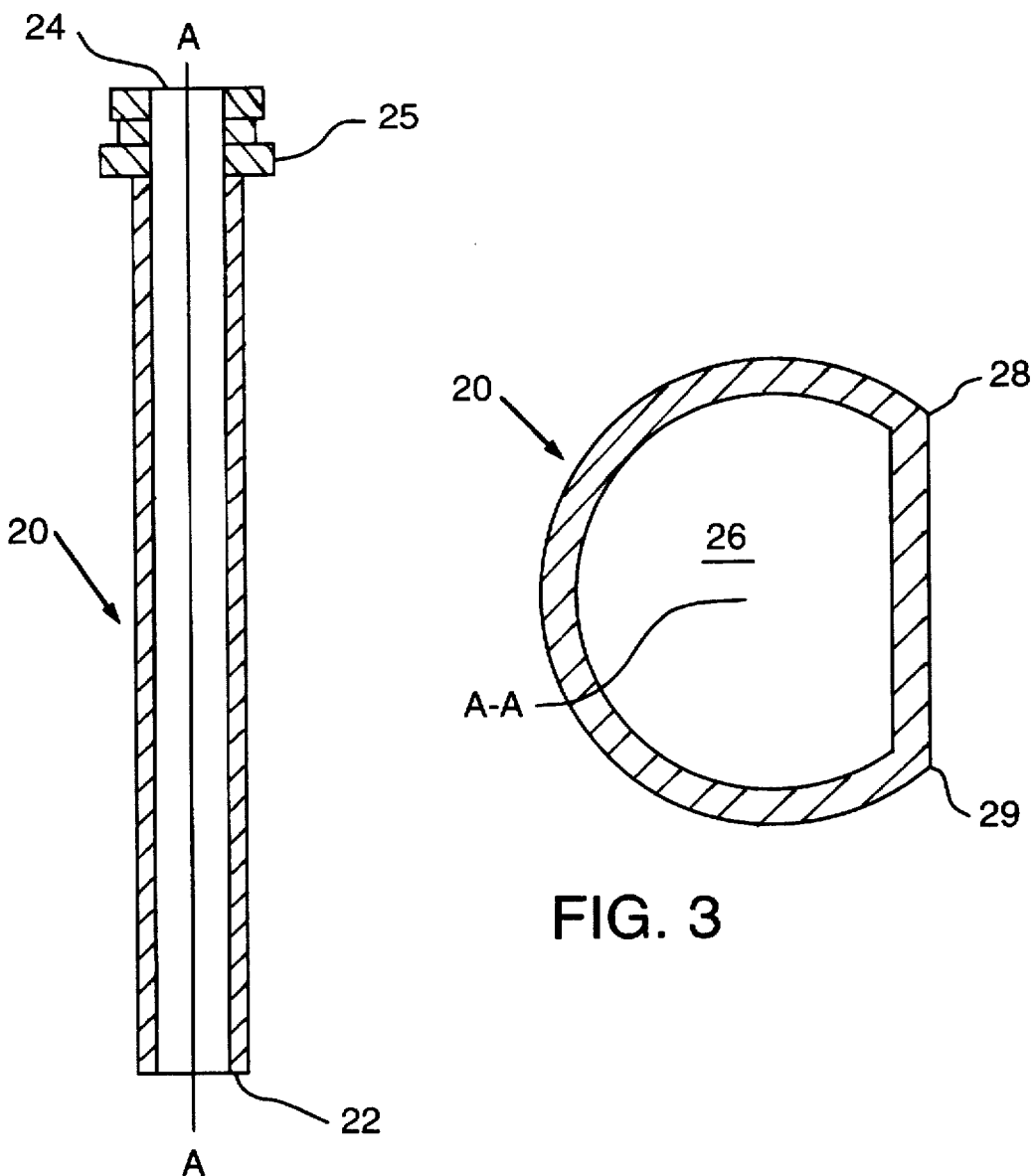
FIG. 2 is a longitudinal cross sectional view of the stem member of a preferred embodiment of the present invention.
FIG. 3 is a lateral cross sectional view of the stem member of a preferred embodiment of the present invention.

The operation of the improved actuator stem 20 and actuator assembly 10 for an article manipulation apparatus, such as a pick and place machine, will be described generally with reference to the drawings for the purpose of illustrating present preferred embodiments of the invention only and not for purposes of limiting the same. In accordance with the present invention, the actuator stem 20 is hollow and has a generally D-shaped cross section 26 along its length and is actuated within a housing assembly 40 having an inner surface 52, at least a portion of which substantially conforms to the D-shaped perimeter of the stem 20. The conformity of the inner surface 52 of the housing assembly 40 to the cross section 26 of the stem 20 prevents the stem from rotating in the plane of the cross section 26.

In a preferred embodiment, the stem 20 is an elongated member having a central axis A—A between first and second ends, 22 and 24, respectively, and having a substantially D-shaped cross section 26 perpendicular to the axis A—A. The second end 24 is preferably disposed in the housing assembly 40 and the first end 22 of the stem 20 extends out of the housing assembly 40. The stem 20 is actuated in a direction substantially parallel to the axis A—A, such that a portion 23 of the stem 20 contacts the inner surface 52 of the housing assembly 40. Generally, a portion 21 of the stem 20 near to and including the first end 22 does not come into contact with the inner surface 52; therefore, the cross sections 26 of the noncontacting portion 21 are not required to have a perimeter that conforms to the inner surface 52 of the housing assembly 40. The substantially flat surface of the D-shaped cross section 26 is defined by two edges, 28 and 29, respectively, which are preferably separated by an angle ranging from 60° to 120° with respect to the central axis A—A. The angle between the first and second edges, 28 and 29, respectively, can be any angle greater than 0° and less than 360°; however, as the angle is increased the cross sectional area decreases and if the angle is sufficiently close to 0° the cross section 26 of the stem 20 may not deviate sufficiently from that of a circle and the stem 20 may rotate in the housing assembly 10. The cross section 26 of the stem 20 does not necessarily have to be a D-shape, but can be made to have any shape in which the cross section 26 has at least one edge. For instance, tear drop, triangular, rectangular as well as other polygons can be used within the scope of the invention to prevent the stem 20 from rotating in various applications. The D-shape cross section 26 is preferred for an actuator stem because the circular design provides for the smallest perimeter for a given cross sectional area which is important is minimizing the amount of friction between the actuator stem 20 and the housing assembly 20 and for flow rate considerations in nozzle type actuator stem applications. The D-shape having two edges 28 and 29, respectively, is further preferred over other designs that have a larger number of edges because the edges, while important for preventing rotation of the stem 20, may affect the performance of the actuator by increasing the amount of wear caused by actuation and may cause the stem 20 to stick in the housing assembly during actuation, both of which degrade the overall performance of the actuator. Additionally, the cross section 26 does not have to be a uniform area or even the same shape over its entire length from the first end 22 to the second end 24. For instance, the friction between the stem 20 and the housing assembly 10 can be reduced if the cross section was only D-shaped over a portion of the length that contacts the housing assembly 40 and the other contacting length is radially smaller in those cross sections than in the D-shaped cross section, such as with alternating bands of D-shaped and other shaped cross sections. Also, that portion of stem 20 that remains external to the housing assembly 40 during the entire stroke length of the stem during actuation does not have to be D-shaped. For example, in nozzle-type actuator stem applications, such as with pick and place machine, in which a vacuum is drawn through the nozzle to pick up a component, the external portion of the nozzle extending outside of the housing assembly 40 can be formed to have a different diameter and shape that can be optimized to pick up components. Alternatively, the actuator stem 20 can be more than one piece that can be removably attachable to produce a variety of effects, such as attaching a wide diameter nozzle end or a cup-like device to the stem 20 to allow a vacuum to be applied over a greater area. The second end 24 is provided with a collar 25 that is used to prevent the accidental removal of the stem 20 from the housing assembly 40 and to provide an attachment location for use in actuating the stem 20. However, other equally suitable embodiments can be used to perform the functions of the collar. A current preferred application of the actuator stem 20 for pick and place machines, and specifically for the Fuji IP-II, is a nozzle that is D-shaped over its entire length with the edges 28 and 29 are separated by an angle of 90° and having a first aperture at the first end 22 and a second aperture at the second end 24 connected by a bore.

The housing assembly 40 preferably includes of a housing 42 having an interior chamber 44 and a first opening 46 and a contacting member 50 having an inner surface 52, an outer surface 54 and two open ends, 56 and 58, respectively, that provide communication between the interior chamber 44 of the housing 42 and the outside of the assembly 10. The second end 24 of the stem 20 is disposed within the interior chamber 44 and the first end 22 extends slidably through the two open ends, 56 and 58, respectively, and the first opening 46. The interior chamber 44 is generally shaped to accommodate the stem 20 when the stem 20 is actuated in the direction of the interior chamber 44 and preferably to allow for actuation of the stem 20 from within the interior of the chamber 44. As a further example of the housing assembly 40, the Fuji IP-II device has a multi-piece housing assembly 40 in which the housing 42 contains a second opening 45 and is connected to the contacting member 50, which in turn is connected to an illuminating disk 47 by conventional methods, such as screws. Additionally, a metal ring 48 and a rubber collar 49 are used to provide a tight fit between the contacting member 50 and the illuminating disk 47 without damaging the disk 47. The second opening 45 communicates with the second end 24 of stem 20, and a vacuum can be applied to the second opening 45 and drawn through the nozzle-type stem 20.

The contacting member 50 is preferably removably attached to the housing 42 to provide for removal of the stem 20 and access to the interior chamber 44 of the housing 42. The outer surface 54 is preferably sized to provide a slip fit with the walls of the interior chamber 46 and is additionally secured by conventional methods, such as by set screws through the wall of the housing 42. Alternatively, in applications where there is not the need to remove the stem 20 or to provide access to the interior chamber 44, or if the application demands that the number of potential loose parts be minimized, the contacting member 50 can be either integrally formed with the housing 42 or attached by a more permanent method, such as welding in the case of metals. The inner surface 52 is shaped to conform to the cross section 26 of the stem 20 so as to prevent the stem 20 from rotating about the axis A—A. In a preferred embodiment, as shown in FIG. 1, only part of the inner surface 52 conforms to the cross section 26 of the stem 20 in order to minimize the amount friction between the stem 20 and the inner surface 52 during actuation. The portion of the contacting member 50 not conforming to the stem 20 provides a low resistance gap 59 between the inner surface 52 and the stem 20.

Figure 5:
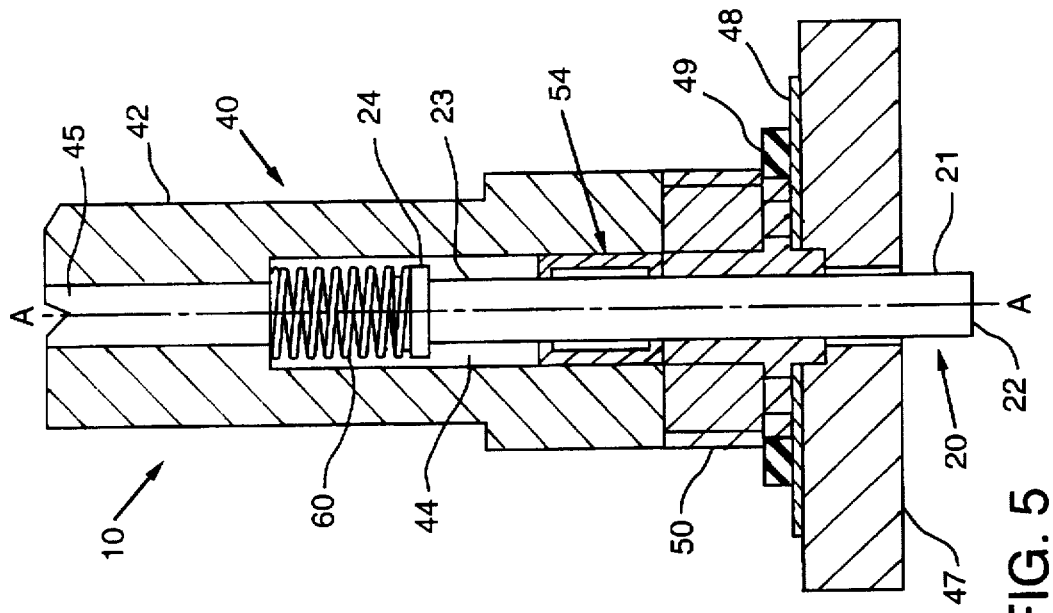
Figure 4:
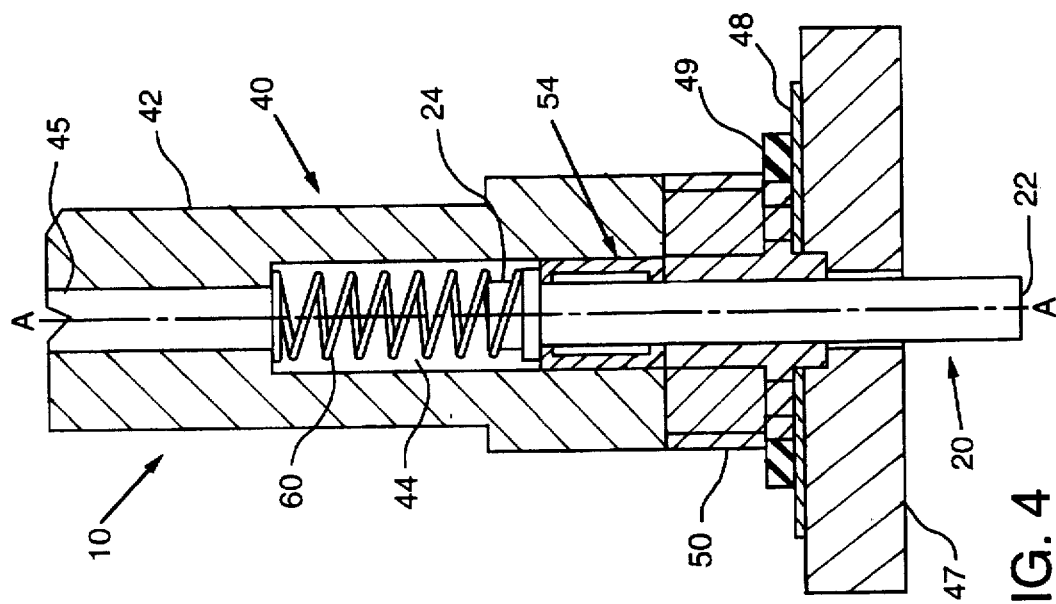
FIG. 4 is a cross sectional view of a preferred embodiment of the present invention using a spring actuator for a pick and place machine in a relaxed mode; and, FIG. 5 is a cross sectional view of a preferred embodiment of the present invention using a spring actuator for a pick and place machine in a compressed mode.

Preferred embodiments are shown in FIG. 1, 4 and 5 with respect to actuators using a spring 60 to provide the actuation. The present invention can be used with any mode of actuation, such as hydraulic, pneumatic or strictly mechanical; however, the problem of the stem 20 rotating about axis A—A commonly arises in spring actuator design, due to the natural twisting force exerted by a spring on a member to which the spring is attached as a result of either the expansion or compression of the spring from its normal rest or relaxed position. As shown in FIGS. 1, 4, and 5, the spring 60 is attached at one end to the second end 24 of the stem 20 by wrapping the end of the spring 60 in a seam in collar 25 attached to the second end 24. The spring 60 is aligned within the interior chamber 44 so that the other end of the spring is positioned adjacent to the wall direct opposing the second end 24 of the stem 20. The application of a force to the stem 20 pushes the spring 60 against the wall, which opposes the force causing the spring to compress. After the force is no longer applied to the stem 20, the compressed spring 60 will expand and return to its rest position.

An example of the utility of the present invention will be described with respect to the use of the stem 20 in the form of a spring actuated nozzle in a pick and place machine, such as the Fuji IP-II. The spring actuated nozzles used in the stationary heads of these machine are generally limited to placing components having approximately a 10 mm×10 mm cross section with an accuracy of ±0.25 mm. For larger size components, the accuracy was significantly less such that the stationary nozzles were not used to place components on the substrate. The standard 4 mm diameter cylindrical nozzle was replaced with a 4 mm nozzle having a D-shaped cross section along its entire length and the contacting member 50, which is in the form of an adaptor in the Fuji machine, was modified so that the inner surface of the adaptor conformed to the D-shaped cross section of the nozzle. The use of the D-shaped nozzle has increased the capability of the stationary nozzle so that it can now be used to place components as large as 28 mm×28 mm with an accuracy of ±0.12 mm.

Those of ordinary skill in the art will appreciate that the present invention provides tremendous advantages over the current state of the art for producing electrical devices. In particular, the present invention provides a way to significantly increase the capacity of existing pick and place machines for placing larger electrical components on electrical device substrates. Also, the present invention allows for more precise placement of components that can result in additional performance gains, such as increased operation times and reduced variability, in the electrical devices produced using the present invention. Thus, the present invention provides a cost effective solution to the production capacity limitations encountered with the use of spring actuators. While the subject invention provides these and other advantages over the prior art for placement of components, in surface mounted placement, as well as die and attach and tape and reel applications, it will be understood, however, that various changes in the details, materials and arrangements of parts which have been herein described and illustrated in order to explain the nature of the invention may be made by those skilled in the art within the principle and scope of the invention as expressed in the appended claims.

What is claimed is:

1. An actuator comprising:

a housing having an inner surface and containing a first opening; and, a stem comprising a nozzle having a first end containing a first aperture, a second end containing a second aperture, a bore providing communication between said first and said second apertures, an axis passing through said first end and second end, and a D-shaped cross section perpendicular to said axis, said stem being slidably disposed in said housing with said first end extending through said first opening substantially parallel to said axis, said inner surface having a conforming portion that conforms to said D-shaped cross section of said stem to prevent said stem from rotating about said axis and to allow said stem to actuate through said first opening substantially along said axis.

2. The actuator of claim 1 wherein said housing has a second opening in communication with said second end.

3. The actuator of claim 1 further comprising a spring disposed in said housing to provide for compressive and expansive force opposing the actuation of said stem substantially along said axis.

4. The actuator of claim 1 wherein said D-shaped cross section includes a first edge and a second edge separated by an angle between 60° and 120°.

5. The actuator of claim 1 wherein:

said stem has a length along said axis; and, said cross section of said stem is D-shaped over substantially all of said length of said axis.

6. The actuator of claim 1 wherein:

said stem has a length along said axis; and, said cross section of said stem is D-shaped over a portion of said length of said axis.

7. The actuator of claim 1 wherein:

said stem has a contacting length along said axis which contacts said inner surface; and, said cross section of said stem is D-shaped over only a portion of said contacting length.

8. The actuator of claim 1 wherein said housing further comprises a contacting member containing said conforming portion, said stem being actuatable through said contacting member.

9. The actuator of claim 8 wherein said housing has a second opening in communication with said second end.

10. The actuator of claim 9 further comprising a spring disposed in said housing to provide for compressive and expansive force opposing the actuation of said stem substantially along said axis.

11. The actuator of claim 10 further comprising means for applying a vacuum to said second opening in said housing; and, said spring is attached to said second end of said stem.

12. The actuator of claim 11 wherein said D-shaped cross section includes a first edge and a second edge separated by an angle between 60° and 120°.

13. The actuator of claim 8 wherein:

said stem has a length along said axis; and, said cross section of said stem is D-shaped over substantially all of said length of said axis.

14. The actuator of claim 8 wherein:

said stem has a length along said axis; and, said cross section of said stem is D-shaped over a portion of said length of said axis.

15. The actuator of claim 8 wherein:

said stem has a contacting length along said axis which contacts said inner surface; and, said cross section of said stem is D-shaped over only a portion of said contacting length.

16. The actuator of claim 1 further comprising means for actuating said stem through said first opening substantially along said axis.

17. The actuator of claim 1, wherein said actuator provides for suction to be drawn from said first end to said second end through said bore.

18. The actuator of claim 17, wherein said housing has a second opening and said suction is drawn through said second opening from said first end through said bore.

19. The actuator of claim 9, wherein:

said actuator provides for suction to be drawn from said first end to said second end through said bore; and, said contacting member prevents fluid communication between said first opening and said second opening.

20. An adaptable stem for an actuator having a housing containing a first opening, said adaptable stem comprising:

a stem comprising a nozzle having a first end containing a first aperture and a second end containing a second aperture, a bore providing communication between said first aperture and said second aperture, an axis passing through said first end and said second end, and a D-shaped cross section perpendicular to said axis, said stem is disposed in said housing with said first end extendible through said first opening substantially parallel to said axis; and, a contacting member disposed in the housing and having an inner surface that conforms to said D-shaped cross section of said stem to prevent said stem from rotating about said axis and to allow said stem to actuate through said contacting member substantially along said axis.

21. The actuator of claim 20 wherein said D-shaped cross section includes a first edge and a second edge separated by an angle between 60° and 120°.

22. The actuator of claim 20 wherein:

said stem has a length along said axis; and, said cross section of said stem is D-shaped over substantially all of said length of said axis.

23. The actuator of claim 20 wherein:

said stem has a length along said axis; and, said cross section of said stem is D-shaped over a portion of said length of said axis.

24. The actuator of claim 20 wherein:

said stem has a contacting length along said axis which contacts said inner surface; and, said cross section of said stem is D-shaped over only a portion of said contacting length.

25. The actuator of claim 20, wherein said contacting member is integral with the housing.

26. A head for a pick and place machine in which suction is used to pick and place components, said head comprising:

a housing having an inner surface and containing a first opening and a second opening;

a stem comprising a nozzle having a first end containing a first aperture, a second end containing a second aperture, a bore providing communication between said first and said second apertures, an axis passing through said first end and second end, and a D-shaped cross section perpendicular to said axis, said stem being slidably disposed in said housing with said first end being extendible through said first opening substantially parallel to said axis, said inner surface having a conforming portion that conforms to said D-shaped cross section of said stem to prevent said stem from rotating about said axis and to allow said stem to actuate through said first opening substantially along said axis, said head providing for suction to be drawn through said second opening from said first end through said first aperture, said bore and said second aperture;

a spring disposed in said housing to provide a compressive and expansive force opposing the actuation of said stem substantially along said axis.

27. A method of handling a component comprising:

providing a stem comprising a nozzle having a first end containing a first aperture, a second end containing a second aperture, a bore providing communication between the first and the second apertures, an axis passing through the first end and the second end, and a D-shaped cross section perpendicular to the axis;

conforming an inner surface of a contacting member disposed around the stem to the D-shaped cross section of the stem to prevent rotation of the stem in the contacting member and to allow the first end of the stem to actuate through the contacting member and contact the component;

drawing suction from the first end of the stem through the first aperture, the bore and the second aperture of the nozzle sufficient to hold the component against the first end;

contacting the first end to the component with sufficient force to allow the component to be held against the first end by the suction through the first aperture; and, picking up the component using the stem.

28. The method of claim 27 further comprising:

placing the component held to the first end in a predetermined location using the stem; and, releasing the suction through the first aperture to release the component in the predetermined location.

29. The method of claim 27, wherein said conforming further comprises conforming the contacting member to allow the stem to actuate substantially along the axis.

30. The method of claim 29 further comprising providing a spring between the stem and the housing to provide compressive and expansive forces opposing the actuation of the stem.

* * * * *